(12) United States Patent
Brethour et al.

(10) Patent No.: US 6,677,796 B2
(45) Date of Patent: Jan. 13, 2004

(54) METHOD AND APPARATUS FOR IMPLEMENTING PRECISION TIME DELAYS

(75) Inventors: Vernon R. Brethour, Owens Cross Roads, AL (US); Marcus H. Pendergrass, Huntsville, AL (US); Ryan N. Confer, Huntsville, AL (US)

(73) Assignee: Time Domain Corp., Huntsville, AL (US)

( * ) Notice: Subject to any disclaimer, the term of this patent is extended or adjusted under 35 U.S.C. 154(b) by 125 days.

(21) Appl. No.: 09/957,646

(22) Filed: Sep. 20, 2001

(65) Prior Publication Data

US 2003/0053572 A1 Mar. 20, 2003

(51) Int. Cl.$^7$ ................................................ H03K 3/00
(52) U.S. Cl. ........................ 327/237; 327/238; 327/248; 327/255
(58) Field of Search .............................. 327/237, 238, 327/248–255, 276–278

(56) References Cited

U.S. PATENT DOCUMENTS

| | | |
|---|---|---|
| 2,716,236 A | 8/1955 | Reinish |
| 3,376,504 A | 4/1968 | Chick |
| 3,461,452 A | 8/1969 | Welter |
| 5,644,260 A * | 7/1997 | DaSilva et al. ............. 327/238 |
| 5,748,891 A | 5/1998 | Fleming |
| 5,774,493 A | 6/1998 | Ross |
| 5,928,293 A | 7/1999 | Jobling et al. |
| 6,002,708 A | 12/1999 | Fleming et al. |
| 6,137,372 A | 10/2000 | Welland |
| 6,304,623 B1 * | 10/2001 | Richards et al. ............ 375/355 |

* cited by examiner

Primary Examiner—Kenneth B. Wells
(74) Attorney, Agent, or Firm—James S. Finn

(57) ABSTRACT

A system and method of implementing precision time delays that provides important and novel improvements over prior techniques of implementing time delays by utilizing a new strategy for selecting the values in the sine and cosine lookup tables. Sine and cosine values which result in non-uniform amplitudes enable increased overall accuracy with fewer bits communicated from the look-up tables to the analogue portion of the system. Further, herein is provided the addition of a variable amplitude threshold crossing capability following the combining of the sine and cosine signals. The time delay accuracy of the resulting phase and amplitude hybrid system can be improved either by increasing the number of bits in the sine/cosine phase management section or by increasing the number of bits in the amplitude section. There is provided herein an optimum strategy for choosing the number of bits used in the phase and amplitude sections for the best overall delay accuracy with the fewest overall control bits.

27 Claims, 12 Drawing Sheets

| Angle Interval | 3-Bit Cosine | 3-Bit Sine |
|---|---|---|
| $I_1$ | 8/8 | 1/8 |
| $I_2$ | 8/8 | 2/8 |
| $I_3$ | 8/8 | 3/8 |
| $I_4$ | 7/8 | 3/8 |
| $I_5$ | 7/8 | 4/8 |
| $I_6$ | 7/8 | 5/8 |
| $I_7$ | 6/8 | 5/8 |
| $I_8$ | 6/8 | 6/8 |
| $I_9$ | 5/8 | 6/8 |
| $I_{10}$ | 5/8 | 7/8 |
| $I_{11}$ | 4/8 | 7/8 |
| $I_{12}$ | 3/8 | 7/8 |
| $I_{13}$ | 3/8 | 8/8 |
| $I_{14}$ | 2/8 | 8/8 |
| $I_{15}$ | 1/8 | 8/8 |

(PRIOR ART)

+ Infinite-precision angle representatives

O N-bit precision angle representatives

N bit precision angle (returned angle)

N=4    (PRIOR ART)

Infinite precision (requested angle)

N=5

N=6

| Angle Interval | 3-Bit Cosine | 3-Bit Sine |
|---|---|---|
| [0, π/16) | 8/8 | 1/8 |
| [π/16, 2π/16) | 8/8 | 2/8 |
| [2π/16, 3π/16) | 7/8 | 4/8 |
| [3π/16, 4π/16) | 6/8 | 5/8 |
| [4π/16, 5π/16) | 5/8 | 6/8 |
| [5π/16, 6π/16) | 4/8 | 7/8 |
| [6π/16, 7π/16) | 2/8 | 8/8 |
| [7π/16, 8π/16) | 1/8 | 8/8 |

| Angle Interval | 3-Bit Cosine | 3-Bit Sine |
|---|---|---|
| $I_1$ | 8/8 | 1/8 |
| $I_2$ | 8/8 | 2/8 |
| $I_3$ | 8/8 | 3/8 |
| $I_4$ | 7/8 | 3/8 |
| $I_5$ | 7/8 | 4/8 |
| $I_6$ | 7/8 | 5/8 |
| $I_7$ | 6/8 | 5/8 |
| $I_8$ | 6/8 | 6/8 |
| $I_9$ | 5/8 | 6/8 |
| $I_{10}$ | 5/8 | 7/8 |
| $I_{11}$ | 4/8 | 7/8 |
| $I_{12}$ | 3/8 | 7/8 |
| $I_{13}$ | 3/8 | 8/8 |
| $I_{14}$ | 2/8 | 8/8 |
| $I_{15}$ | 1/8 | 8/8 |

METHOD AND APPARATUS FOR IMPLEMENTING PRECISION TIME DELAYS

BACKGROUND OF THE INVENTION

1. Field of the Invention

The present invention generally relates to the implementation of time delays, and more specifically, to a system and a method of implementing high precision time delays that can be utilized in an impulse radio system for significant system improvements.

2. Background of the Invention and Related Art

It is very common for electronic systems to require digitally controlled variable time delays between signals. If the desired delay can be achieved with a smallest step size as big as a clock in a synchronous system, then a counter and a comparator can provide the desired delay. The previous methodologies and structure to accomplish this are illustrated in FIG. 1 wherein clock 10 and reset 35 are inputs to counter 15. The output of counter 15 is input to digital compare 25 which has delay count 30 as prior input, thus enabling delay out 25.

If the desired delay can be achieved with a smallest step size, which can be as big as the propagation time of a logic gate in a digital system, then a tapped delay line with digital selection of the delay tap can provide the desired delay as in FIG. 2 at 205. Clock 205 provides tap inputs 215. Delay count 225 thus allows for a delay out 210 which can correspond to a desired delay by simply choosing the delay tap.

If the desired delay can be achieved with a smallest step size, which must be smaller than the propagation time of a logic gate in a digital system, then a voltage ramp into a variable threshold trigger device is often used where the delay is affected by digitally controlling the trigger voltage (threshold) of the trigger device. This is illustrated in FIG. 3 wherein clock 305 is input to a voltage ramp device 310, the output of which is input to an analog compare 315. A second input to said analog compare 315 is from a delay count 325 passing through a digital to analog converter 330. Thus, the output of analog compare 315 is a delay out of a smallest step size that can be smaller than the propagation time of a logic gate.

The technique in FIG. 3 suffers from the requirement that the variable threshold trigger device must be implemented with a great many (for example 256) perfectly equal step sizes in the trigger voltage, as well as requiring a voltage ramp, which is perfectly linear over the entire range of the steps. To the extent that either the ramp deviates from perfect linearity or the threshold step sizes deviate from perfectly uniform steps, then the resulting time delays will include undesirable non-uniform increments between steps.

A time delay technique which overcomes the aforementioned problems with the voltage ramp in FIG. 3 has been addressed in a patent application entitled, "Precision Timing Generator System and Method", Ser. No. 09/146,524, filed Sep. 3, 1998 invented by Preston Jett and with a common assignee of the present invention. Said patent is incorporated herein by reference in its entirety and the techniques for overcoming the aforementioned shortcomings illustrated in FIG. 3 will be referred to as the "Jett delay technique". As illustrated in FIG. 4, the Jett delay technique uses a quadrature approach wherein sine and cosine values are picked, which result in the most uniform possible amplitude of the resulting delayed sine wave and wherein the input clock signal 405 is a sine wave, which is processed into two intermediate phase shifted signals where one intermediate signal is phase shifted forward 45 degrees 410 and the other intermediate signal is phase shifted backward 45 degrees 415. These two intermediate signals are then multiplied, at 420, by digitally specified scaling quantities and summed together, at 425, to produce an output signal with precisely controlled time delay. The digital specific scaling quantities are provided by inputting a delay count 435 to a lookup table 440 and outputting said result to the respective multipliers after having passed through digital to analog converters 445 and 450.

The difficulty with the technique shown in FIG. 4 can be illustrated by considering the specific example of a delay design which is required to produce 256 steps. The look-up tables (e.g., 440 in FIG. 4) containing the scaling factors for the leading and trailing signals are most conveniently implemented in devices fabricated with CMOS, but the actual analog signal processing is most conveniently done with devices fabricated in Gallium Arsinide or Silicon Germanium (SiGe) where faster electronic devices are available. For this example, we assume that the faster devices are fabricated on a SiGe device. For the case of 256 delay steps, the Jett invention requires eight bits of delay specification, which index into a CMOS look-up table, which, in turn, provides eight bits of scaling factor for both the leading and lagging signals. The resulting dilemma is that it is necessary to move 16 bits from the CMOS device to the SiGe device. In the Jett invention, the values in the CMOS lookup table were the values of the sine and cosine functions corresponding to the number of degrees of delay that was desired.

Thus a strong need to overcome the limitations of existing systems and methods of implementing precision time delays exists.

SUMMARY OF THE INVENTION

Briefly stated, the present invention provides a system and method of implementing precision time delays that provides important and novel improvements over prior techniques of implementing time delays by utilizing a new strategy for selecting the values in the sine and cosine lookup tables. Sine and cosine values which result in non-uniform amplitudes enable increased overall accuracy with fewer bits communicated from the look-up tables to the analogue portion of the system. Further, herein is provided the addition of a variable amplitude threshold crossing capability following the combining of the sine and cosine signals. The time delay accuracy of the resulting phase and amplitude hybrid system can be improved either by increasing the number of bits in the sine/cosine phase management section or by increasing the number of bits in the amplitude section. An optimum strategy for choosing the number of bits used in the phase and amplitude sections for the best overall delay accuracy with the fewest overall control bits is also enabled.

Therefore, it is an object of the present invention to provide a system and method of implementing precision time by utilizing a new strategy for selecting the values in the sine and cosine lookup tables.

It is another object of the present invention to provide sine and cosine values which result in non-uniform amplitudes.

It is still another object of the present invention to provide a variable amplitude threshold crossing capability following the combining of the sine and cosine signals.

It is yet another object of the present invention to provide an optimum strategy for choosing the number of bits used in the phase and amplitude sections.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

The present invention will now be described more fully in detail with reference to the accompanying drawings, in which the preferred embodiments of the invention are shown. This invention should not, however, be construed as limited to the embodiments set forth herein; rather, they are provided so that this disclosure will be thorough and complete and will fully convey the scope of the invention to those skilled in art. Like numbers refer to like elements throughout.

The present invention relates to electronic devices, which include in their functionality, precisely controlled time delays between events or signals. Specifically, this invention enables digitally controlled time delays, with a step size smaller than the delay of a logic gate for the electronic technology being used. Most particularly, the invention provides an optimum strategy for the implementation of time delays, which are achieved by a combination of digitally controlled phase and amplitude processing of an input signal.

Figure 1:
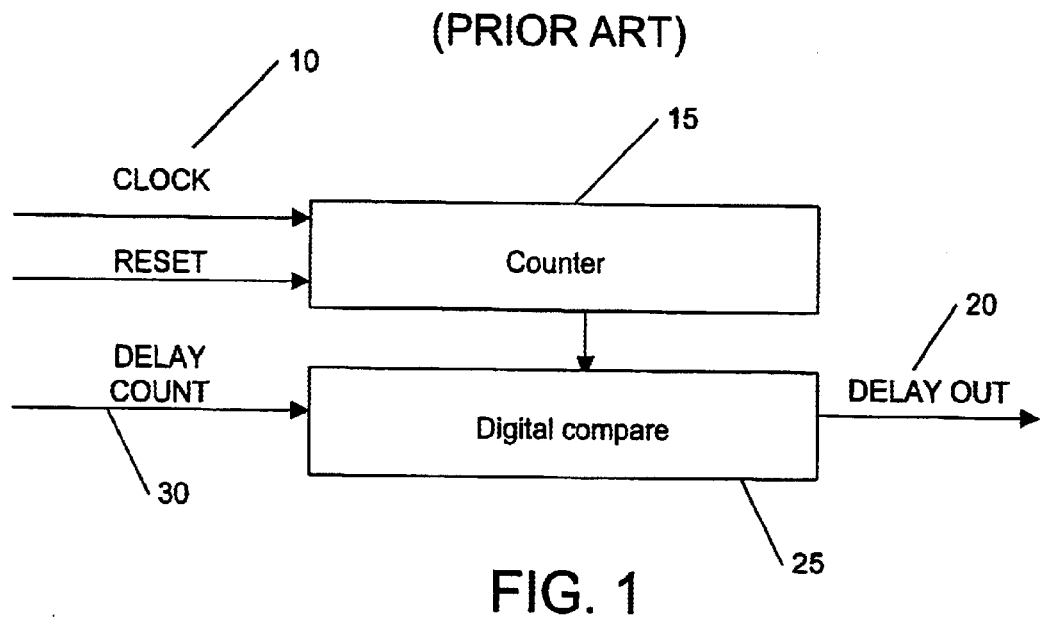
FIG. 1 illustrates an example of a time delay system using a counter and a comparator to achieve clock size delay steps.
Figure 2:
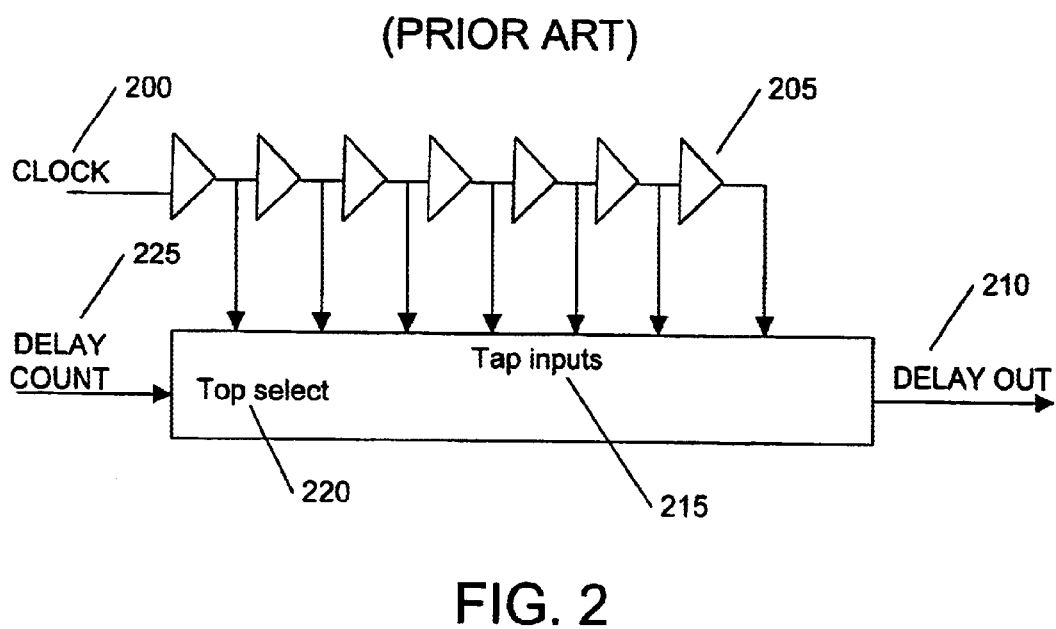
FIG. 2 illustrates an example of a time delay system using a tapped digital delay line to achieve gate delay size delay steps.
Figure 3:
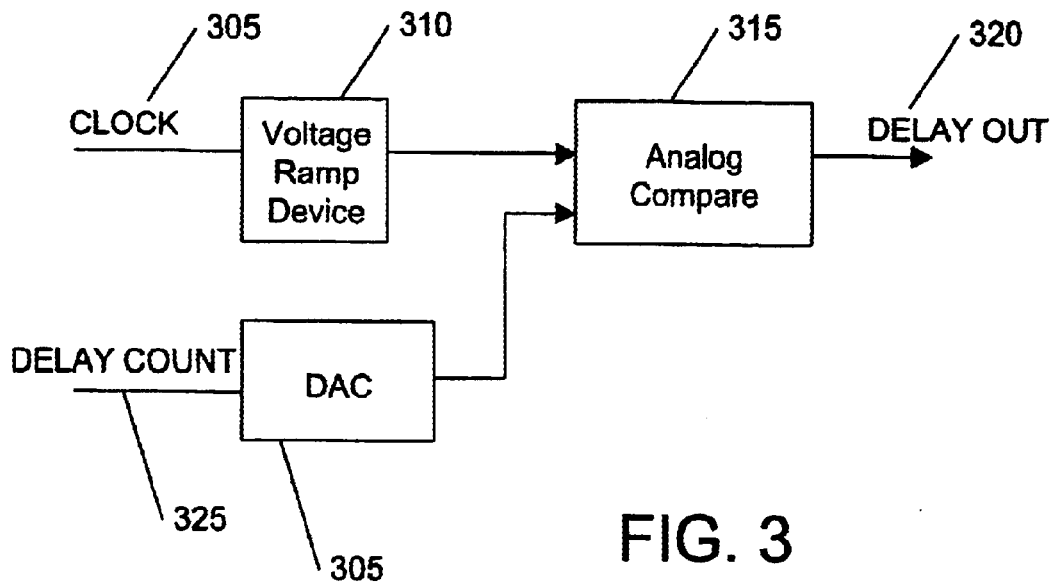
FIG. 3 illustrates an example of a time delay system using a voltage ramp and a variable amplitude trigger circuit to achieve delay steps smaller than a gate delay.
Figure 4:
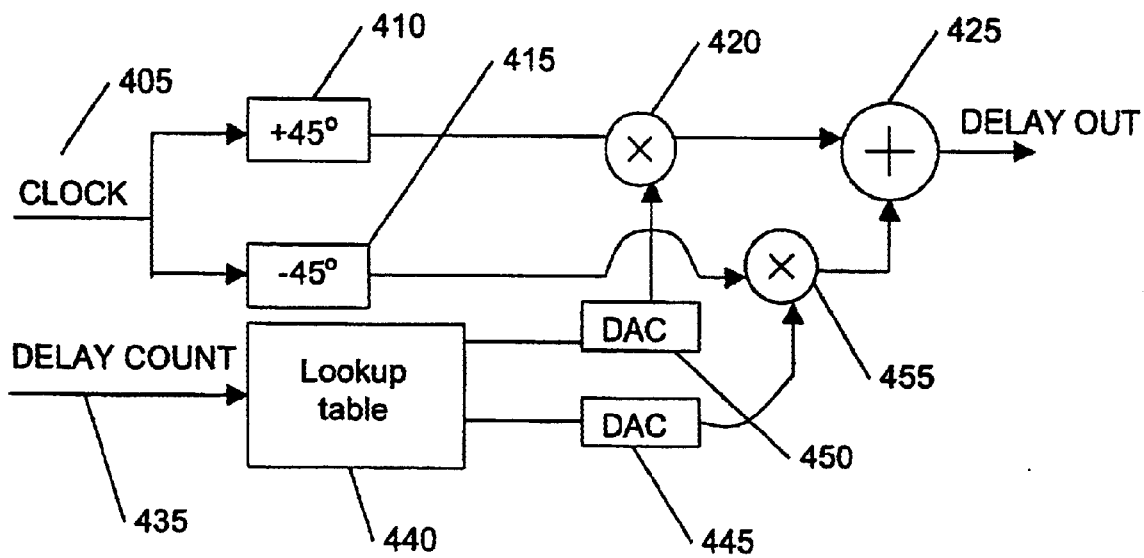
FIG. 4 illustrates an example of a time delay system using the Jett technique.
Figure 5:
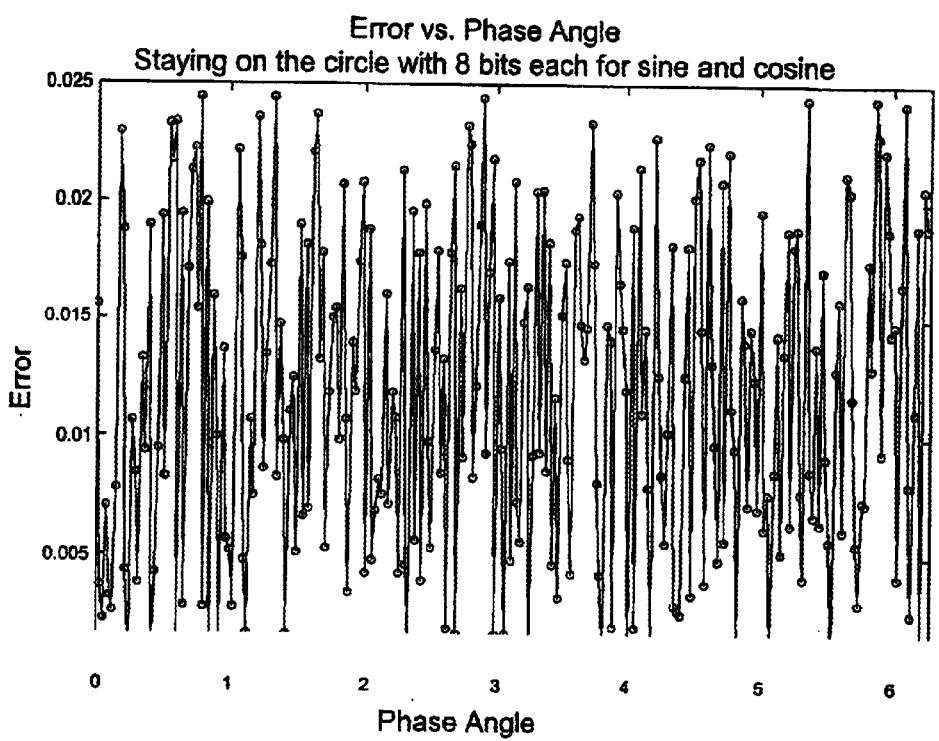
FIG. 5 is a plot of the egregious step size errors resulting from use of the Jett technique.

FIG. 5 is an example of the error resulting from the Jett technique for finding phase shifts without any amplitude thresholding and using uniform step size by staying on the circle. The error rate graph was plotted in MATLAB by comparing the phase shifts resulting in dividing the circle into 256 (2^8 bits) equal sections to those produced by Jett technique of sine and cosine modulation. The error is the absolute difference between the requested phase shift and the returned phase shift.

Figure 6A:
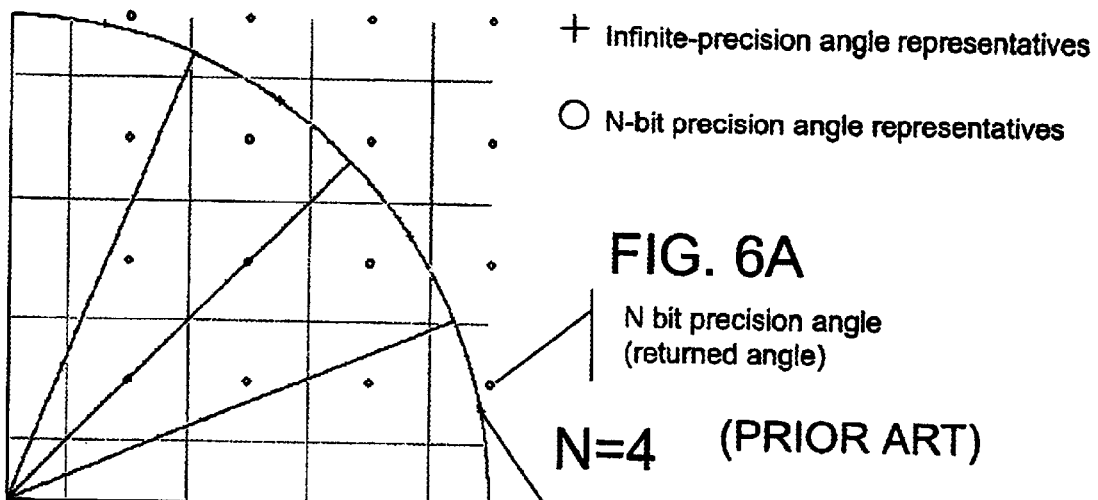
FIGS. 6A–C shows the selection strategy for sine and cosine for use by the Jett technique.
Figure 6B:
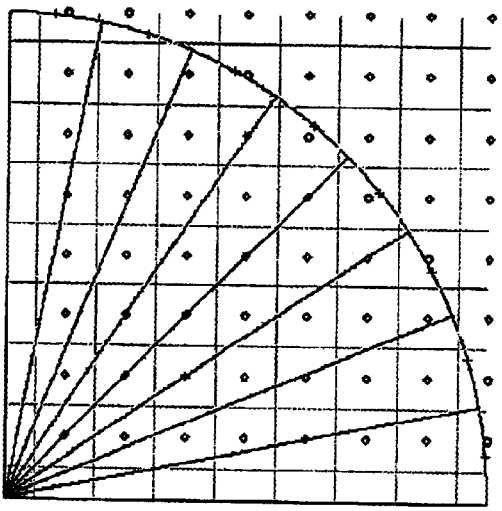
Figure 6C:
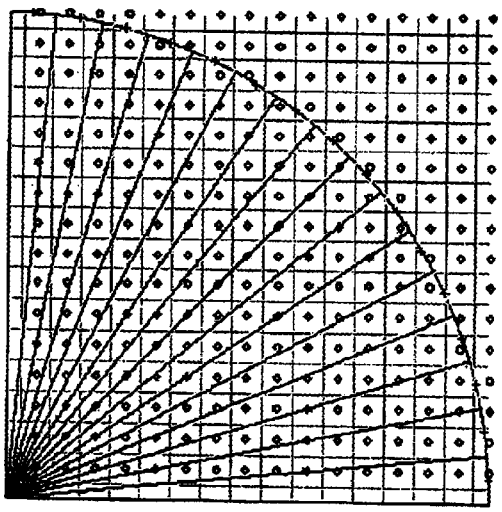

FIG. 6 displays the Jett technique for phase shift selection for 0 to 90 degrees. The Jett technique uses N number of bits with N=4 in FIG. 6A; N=5 in FIG. 6B; N=6 in FIG. 6C to create a lattice of points each of which is the center of a square. This lattice is a 2^N by 2^N square. This lattice is then overlaid on a circle of radius 1 and the useable phase shift angles are determined from that diagram. Infinite-precision angles are created by dividing the circle in X number of equal parts depicted in FIGS. 6A–6C. The N-bit precision angle that is used to create the CMOS lookup tables is obtained simply by rounding the coordinates of the infinite precision angle to N binary digits. Graphically, this is equivalent to finding the lattice point that occupies the same square as the infinite-precision angle. In other words, the closest lattice point to the infinite precision angle. The method results in 2^N members in the sine and cosine tables, however some members can be used more than once.

Figure 7:
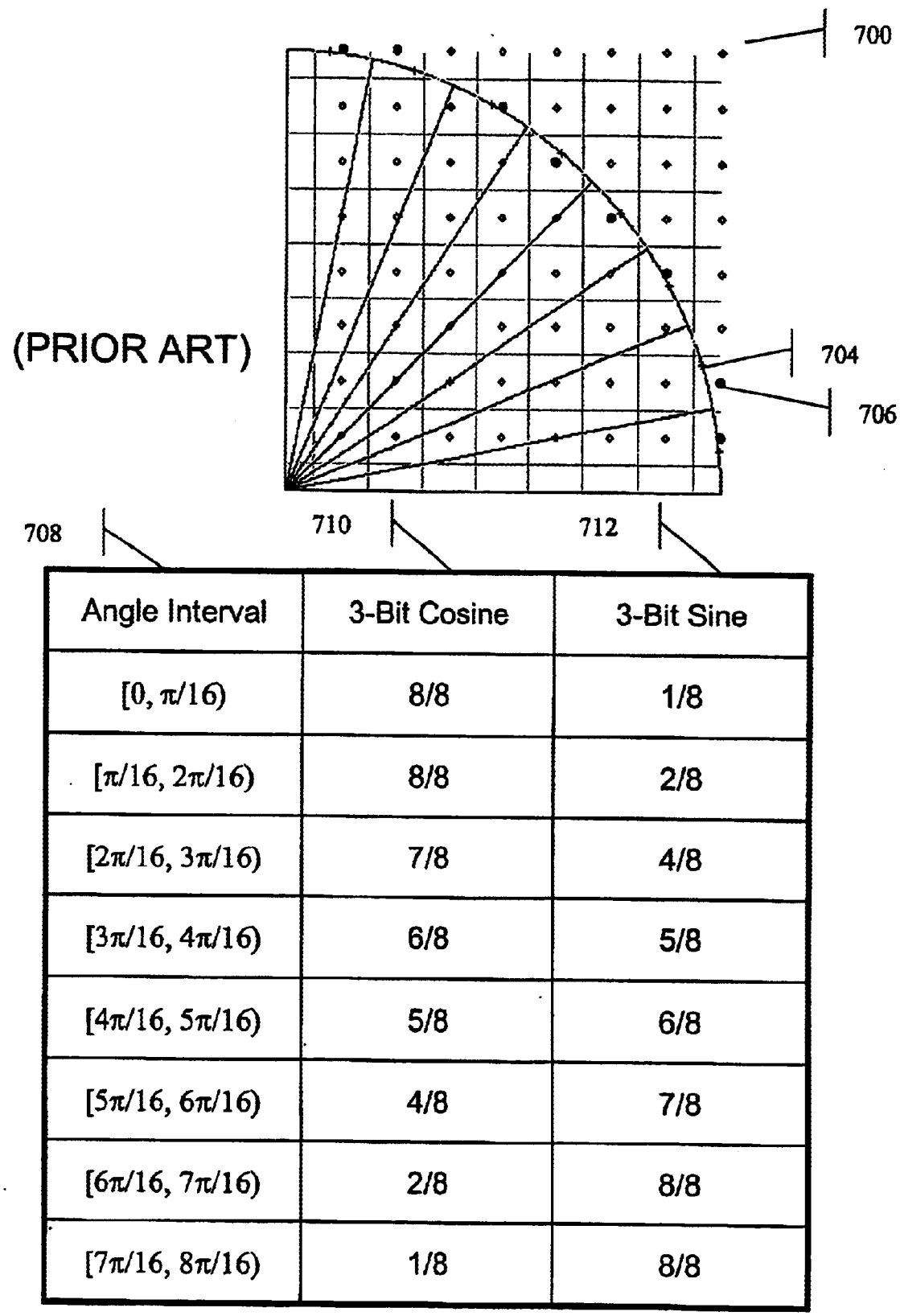
FIG. 7 shows the detailed selection strategy for sine and cosine for use by the Jett technique for three bits each for the sine and cosine tables and three bits of requested angle.

FIG. 7 shows a detailed example of sine and cosine selection strategy for using three bits each of sine and cosine to form the tables and three bits worth of requested angle for 0 to 90 degrees. The lattice 700 formed by using three bits each for the sine and cosine tables overlaid on a circle of radius one. At 704 is an example of the infinite-precision angles found by dividing the circle into 2^3 equal sections. At 706 is the N-bit precision angle; the closest lattice point to an infinite-precision angle. The angle interval table 708 is a table of the angle intervals between the infinite-precision angles. The value column 710 illustrates the values used to determine the cosine values corresponding to angle interval 708, and 3-bit sine 712 is a table of the values used to determine the sine values corresponding to the angle interval 708.

Figure 8:
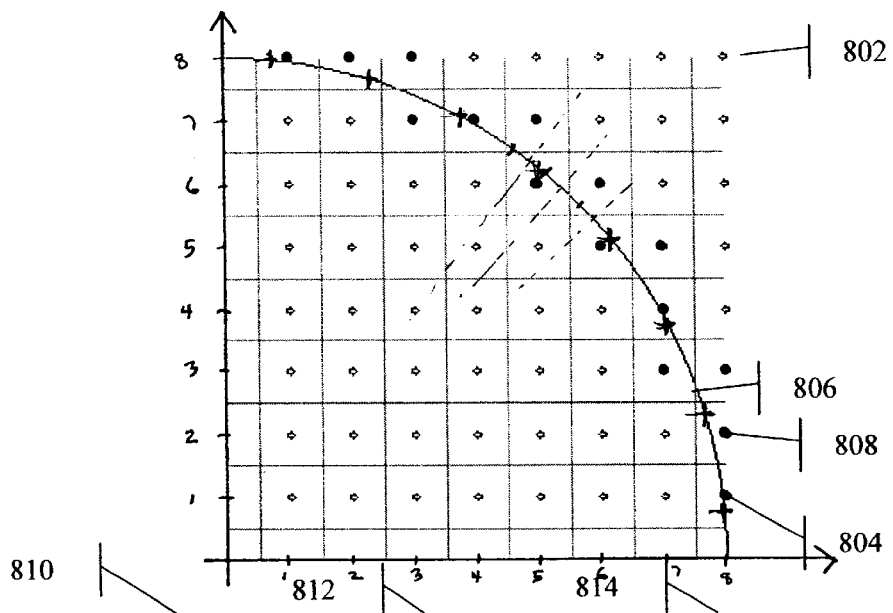
FIG. 8 shows the selection strategy for sine and cosine for use by the Pendergrass technique.

FIG. 8 is an example of the novel technique of the present invention for sine and cosine value selection. This method differs from the Jett technique by deviating from the circle, resulting in sine and cosine values with varying amplitude values. The lattice points 802 are made in the same fashion, as are the infinite-precision angles 806. The N-bit precision angles 808 are determined by selecting all lattice points that belong to squares which intersect the circle of values 1. The advantage of this method is that a larger number of N-bit precision angles are available for approximating requested infinite precision angles, resulting in a lower approximation error. The table at 810 shows the table of angle intervals corresponding to the cosine 812 and sine 814 values created by the methods of the present invention.

Figure 9:
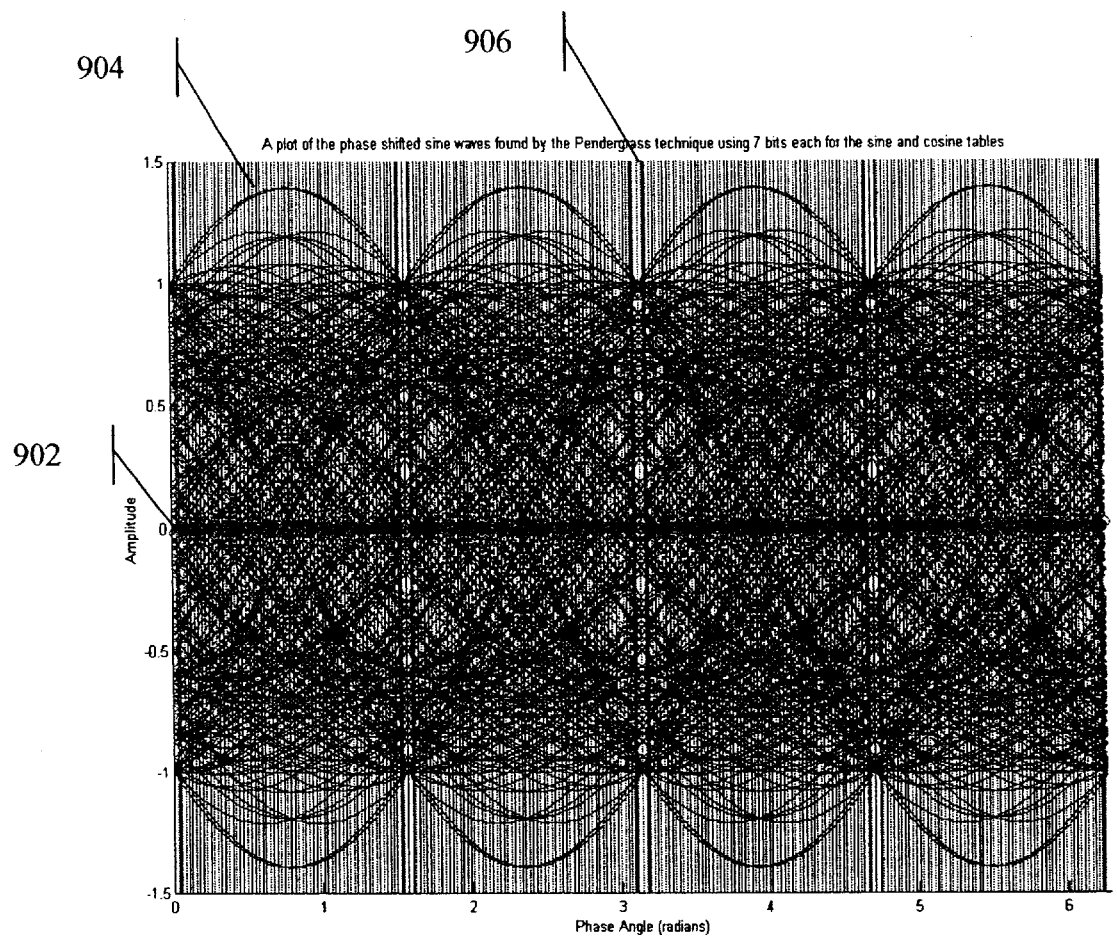
FIG. 9 depicts the phase shifted sine waves resulting from the Pendergrass technique using 7 bits each for the sine and cosine tables and 0 bits of amplitude thresholding.

FIG. 9 shows a plot of the sine waves resulting from the Pendergrass method for 7 bits used to form the sine and cosine tables and 0 bits of amplitude thresholding with 8 bits worth of requested angles. 902 represents one of the returned phase shift angles. 904 represents one of the sine waves produced by the method with the appropriate amplitude variation and phase shift and FIG. 906 shows the requested angles.

Figure 10:
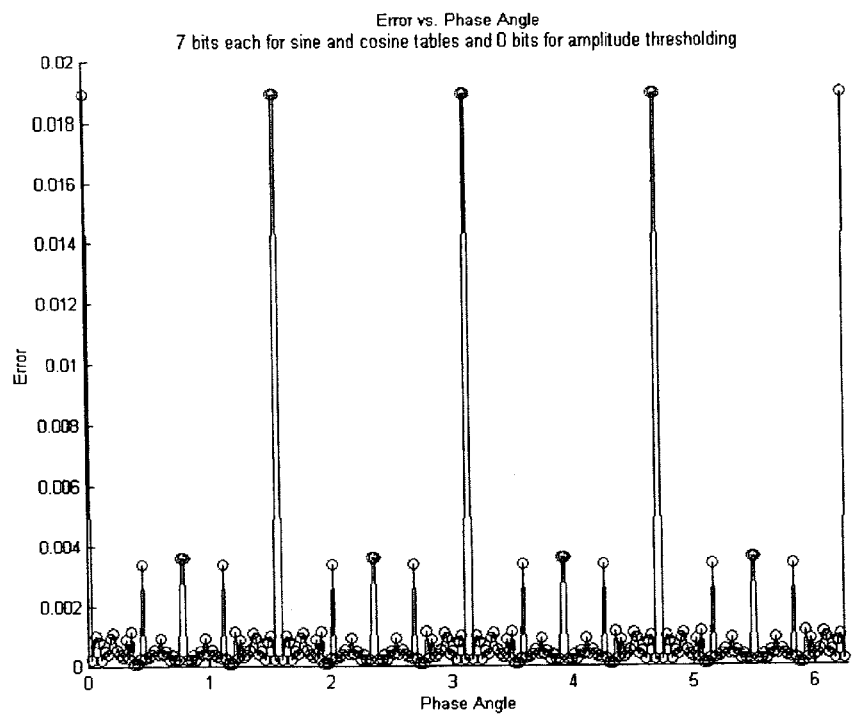
FIG. 10 illustrates a plot of the minimal step size errors resulting from use of one of the technique herein described.

FIG. 10 is a plot of error rate vs. phase angle using the system and methods of the present invention for 7 bits each for the sine and cosine tables, without any bits for amplitude thresholding.

Figure 11:
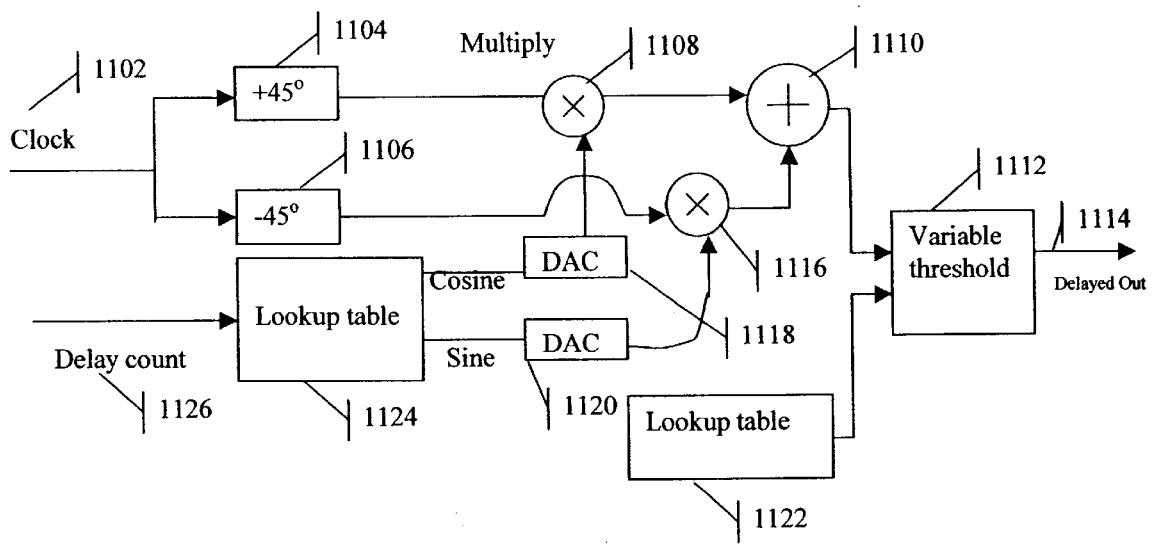
FIG. 11 illustrates an example of a time delay system using the Jett technique enhanced with a variable amplitude trigger as provided in this invention.

FIG. 11 is an example of a time delay system of the present invention with a variable amplitude trigger. Wherein one clock signal (clock signal A) is phase shifted 45 degrees forward 1104 and one clock signal (clock signal B) is shifted 45 degrees backward. Clock signal A is multiplied 1108 by the output of a digital to analog converter 1118 which received as its input the cosine value output of lookup table 1124. Delay count 1126 is input to lookup table 1124. The 45 degree backward shifted clock signal 1106 is multiplied by the output signal from digital to analog converter 1120 which received as its input the sine value output of lookup table 1124. The same delay count 1126 is used for the input to lookup table 1124.

The result of the multiplication of the output of digital to analog converter 1118 and the 45 degree forward phase shifted clock signal 1104 is added at 1110 to the result of the multiplication of the output of the digital to analog converter 1120 and the backward phase shifted clock signal 1106. The sum of said signals is input to a variable threshold 1112. Also input to said variable threshold 1112 is another lookup table 1122 to produce delayed out 1114.

Figure 12:
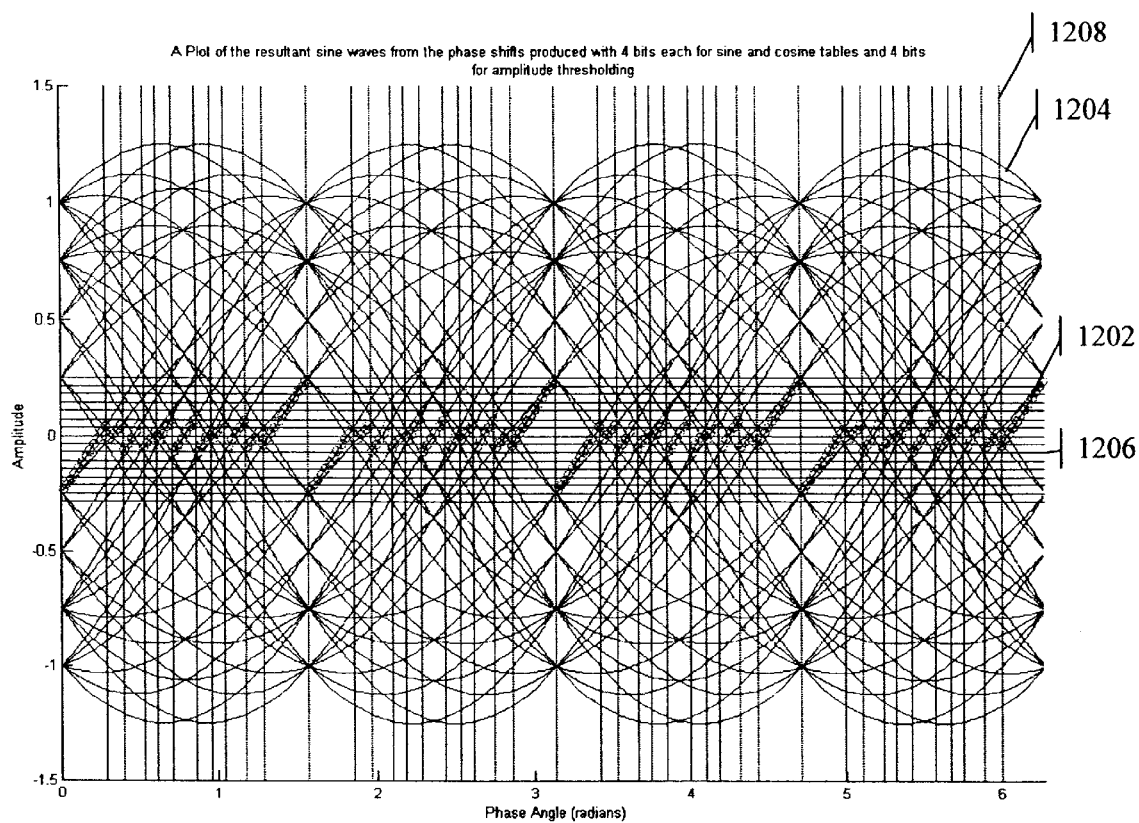
FIG. 12 illustrates a plot of the phase shifted sine waves resulting from the present invention techniques using 4 bits each for the sine and cosine tables and 4 bits worth of amplitude thresholding.

FIG. 12 shows a plot of the sine waves resulting from the methods of the present invention for 4 bits used to form the sine and cosine tables and 4 bits of amplitude thresholding with 8 bits worth of requested angles. FIG. 12 at 1202 represents one of the returned phase shift angles; 1204 represents one of the sine waves produced by the method with the appropriate amplitude variation and phase shift; 1206 shows one of the amplitude thresholds produced by the technique; 1208 shows the requested angles.

Figure 13:
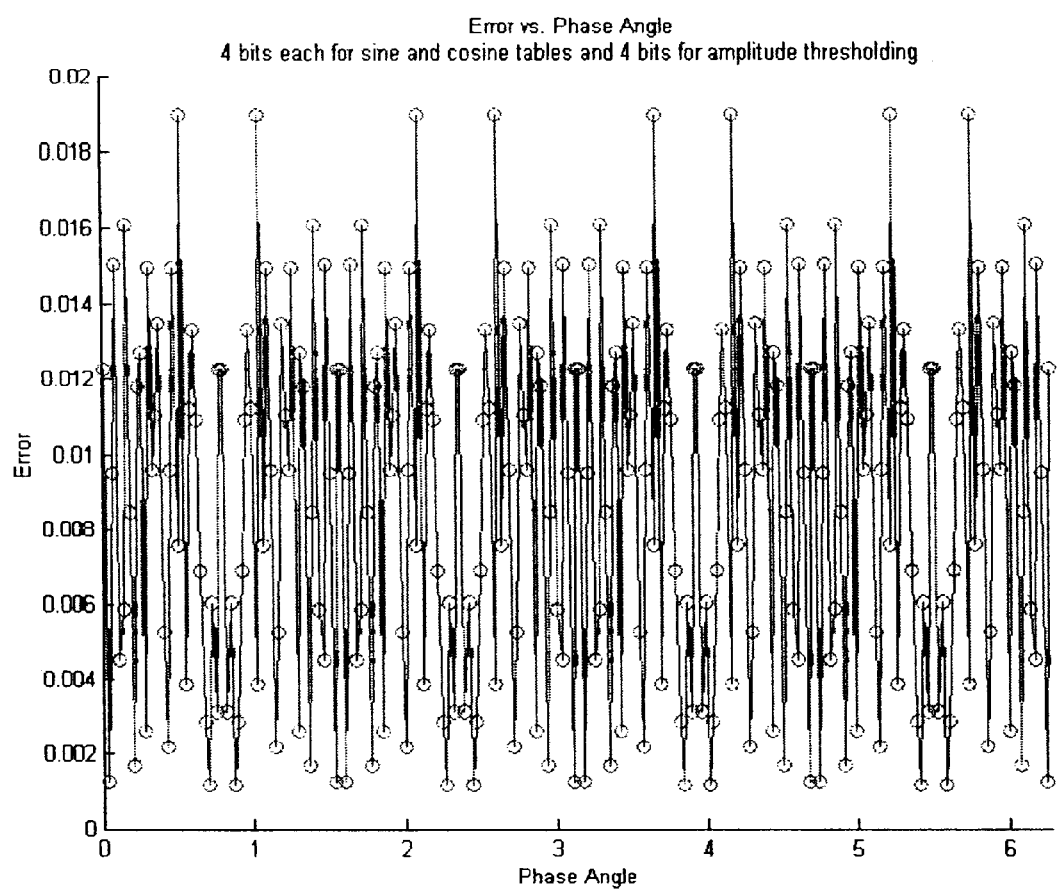
FIG. 13 illustrates a plot of the minimal step size errors resulting from use of the {4,4,4} technique.

FIG. 13 is a plot of error rate vs. phase angle using the system and methods of the present invention for four bits each for the sine and cosine tables and four bits of amplitude thresholding.

Figure 14:
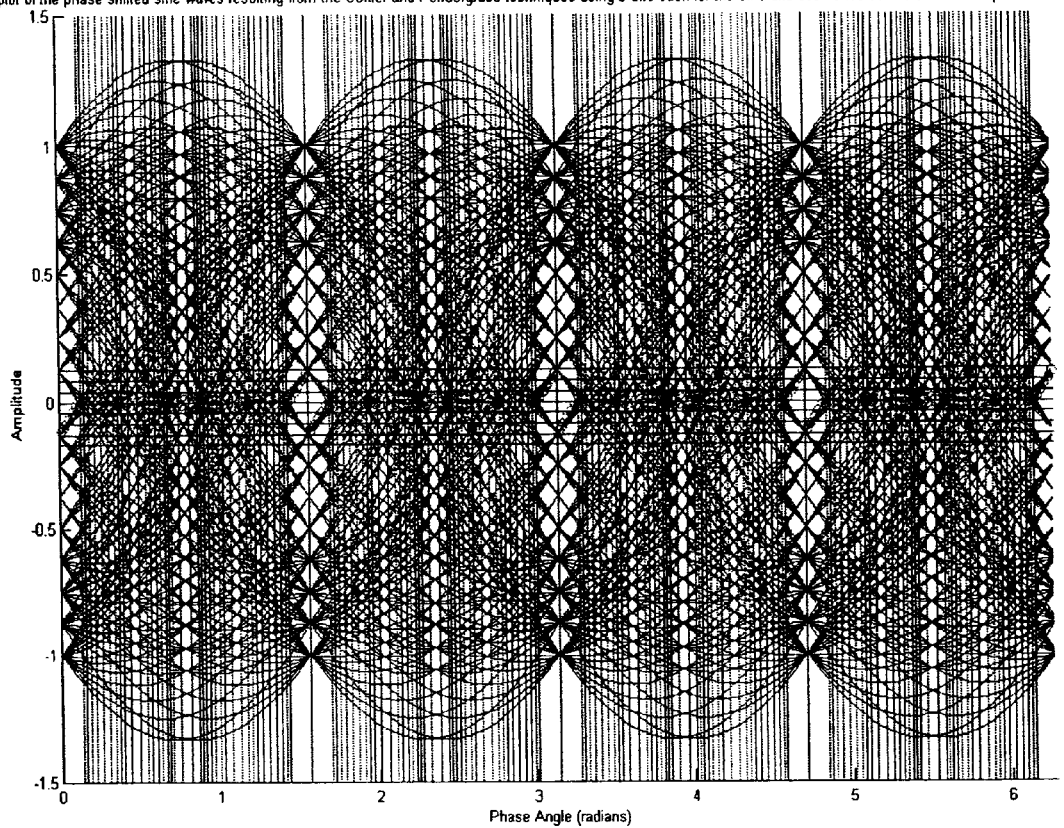
FIG. 14 illustrates a plot of the phase shifted sine waves and the amplitude thresholds produced by the present invention techniques using 5 bits for each of the sine and cosine tables and 3 bits worth of amplitude thresholding.

FIG. 14 shows a plot of the sine waves resulting from the techniques of the present invention with 5 bits used to form the sine and cosine tables and 3 bits of amplitude thresholding with 8 bits worth of requested angles. FIG. 14 at 1402 represents one of the returned phase shift angles; 1404 represents one of the sine waves produced by the method with the appropriate amplitude variation and phase shift; 1406 shows one of the amplitude thresholds produced by the technique; 1408 shows the requested angles.

Figure 15:
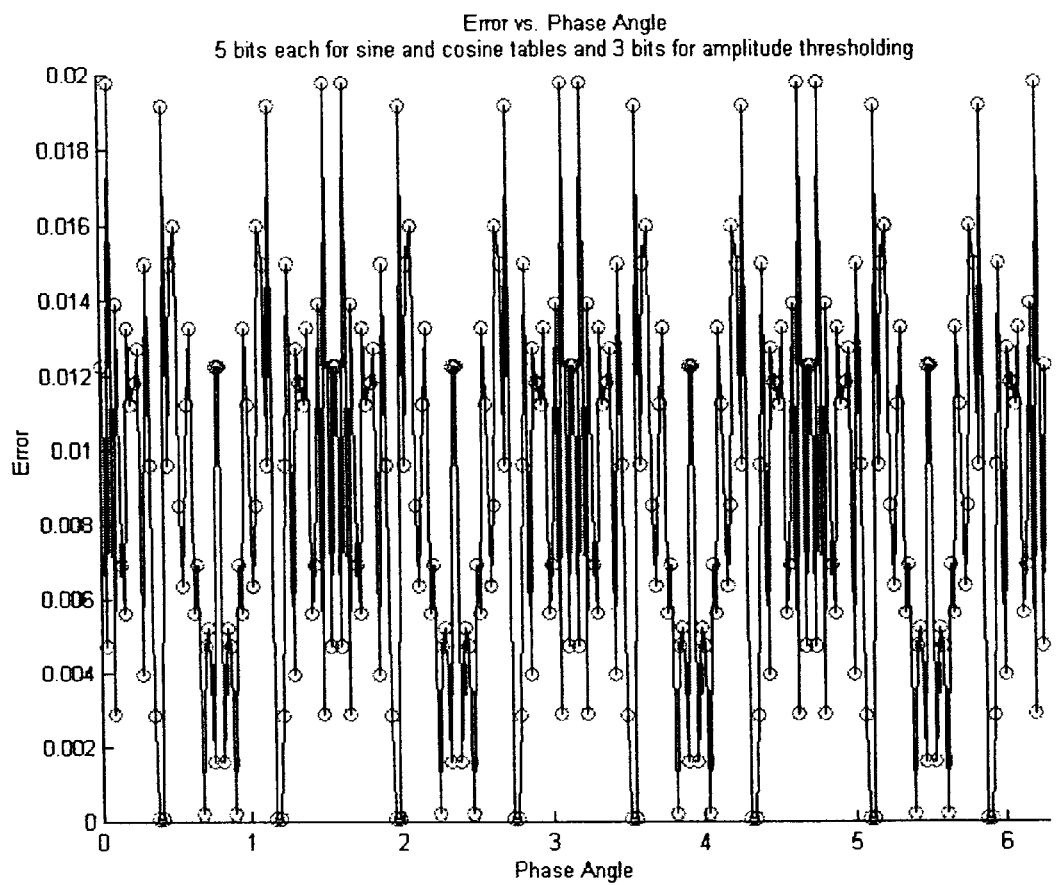
FIG. 15 depicts a plot of the step size errors resulting from use of the {5,5,3} technique.

FIG. 15 is a plot of error vs. phase angle for 5 bits each for the sine and cosine tables and 3 bits for amplitude thresholding. While the error is slightly higher than with the 4—4—4 set up shown in FIG. 13, this combination of techniques may be preferable because it is sometimes more difficult to implement thresholding bits than it is to implement bits used for the sine and cosine tables.

The following is a table illustrating the various instantiations of the present invention including on or off circle scaling factors, optimized or binary step sizes and whether or not the output of the summed signal is amplified.

| CIRCLE | STEP | AMPLIFICATION |
|--------|------|---------------|
| ON | BINARY | NONE |
| ON | BINARY | YES |
| ON | OPTIMIZED | NONE |
| ON | OPTIMIZED | YES |
| OFF | BINARY | NONE |
| OFF | BINARY | YES |
| OFF | OPTIMIZED | NONE |
| OFF | OPTIMIZED | YES |

The first column, "CIRCLE" represents whether or not the scaling factor is on or off circle with the second column, "STEP", showing whether or not the step size is binary or optimized. Whether or not the signal is amplified is shown in the third, "AMPLIFICATION" column.

While particular embodiments of the invention have been described, it will be understood, however, that the invention is not limited thereto, since modifications may be made by those skilled in the art, particularly in light of the foregoing teachings. It is, therefore, contemplated by the appended claims to cover any such modifications that incorporate those features or those improvements that embody the spirit and scope of the present invention.

What is claimed is:

1. A system of implementing precision time delays, comprising:

a clock input, said clock input being split into at least two separate clock inputs with a specified phase shift therebetween;

a delay count providing input to a first lookup table, said first lookup table providing a first output to a first digital to analog converter, the output of said first digital to analog converter being multiplied with at least one of said at least two separate clock inputs thereby providing a first multiplied signal, said first lookup table also providing a second output to a second digital to analog converter, the output of said second digital to analog converter being multiplied with a second of said at least two separate clock inputs to provide a second multiplied signal;

an addition and output means to add said first multiplied signal to said second multiplied signal;

a variable threshold, said variable threshold receiving as one input the output of said addition and output means; and a second lookup table, said second lookup table's output providing a second input to said variable threshold, thereby enabling a desired delayed output signal from said variable threshold.

2. The system of implementing precision time delays of claim 1, wherein said first and said second outputs from said first lookup table are on circle scaling factors.

3. The system of implementing precision time delays of claim 2, wherein said first and said second outputs from said first lookup table are on circle scaling factors and wherein the output of said first and said second digital to analog converter has binary step sizes.

4. The system of implementing precision time delays of claim 2, wherein said first and said second outputs from said first lookup table are on circle scaling factors and wherein the output of said first and said second digital to analog converter has optimized step sizes.

5. The system of implementing precision time delays of claim 1, wherein said first and said second outputs from said first lookup table are off circle scaling factors.

6. The system of implementing precision time delays of claim 5, wherein said first and said second outputs from said first lookup table are on circle scaling factors and wherein the output of said first and said second digital to analog converter has binary step sizes.

7. The system of implementing precision time delays of claim 5, wherein said first and said second outputs from said first lookup table are on circle scaling factors and wherein the output of said first and said second digital to analog converter has optimized step sizes.

8. The system of implementing precision time delays of claim 1, wherein said at least two clock inputs are split into two distinct clock inputs.

9. The system of implementing precision time delays of claim 8, wherein said specified phase shift difference is 90 degrees between said two distinct clock inputs.

10. The system of implementing precision time delays of claim 9, wherein a first of said two distinct clock inputs is phase shifted 45 degrees forward and a second of said two distinct clock inputs is phase shifted 45 degrees backward.

11. The system of implementing precision time delays of claim 9, wherein a first of said two distinct clock inputs is phase shifted 45 degrees forward and a second of said two distinct clock inputs is phase shifted 45 degrees backward.

12. The system of implementing precision time delays of claim 9, wherein a first of said two distinct clock inputs is phase shifted 45 degrees forward and a second of said two distinct clock inputs is phase shifted 45 degrees backward.

13. The system of implementing precision time delays of claim 9, wherein a first of said two distinct clock inputs is not phase shifted and a second of said two distinct clock inputs is phase shifted 90 degrees backward.

14. The system of implementing precision time delays of claim 9, wherein a first of said two distinct clock inputs is not phase shifted and a second of said two distinct clock inputs is phase shifted 90 degrees forward.

15. The system of implementing precision time delays of claim 9, wherein a first of said two distinct clock inputs is phase shifted 90 degrees forward and a second of said two distinct clock inputs is not phase shifted.

16. The system of implementing precision time delays of claim 9, wherein a first of said two distinct clock inputs is phase shifted 90 degrees backward and a second of said two distinct clock inputs is not phase shifted.

17. A method of implementing precision time delays, comprising the steps of:

splitting a clock input into at least two separate clock inputs with a specified phase shift therebetween;

inputting a delay count into a first lookup table, said lookup table providing a first off circle scaling factor to a first digital to analog converter, the output of said first digital to analog converter being multiplied with at least one of said at least two separate clock inputs thereby providing a first multiplied signal, said lookup table also providing a second off circle scaling factor to a second digital to analog converter, the output of said second digital to analog converter being multiplied with a second of said at least two separate clock inputs to provide a second multiplied signal;

adding said first multiplied signal to said second multiplied signal and outputing said added signal;

using a variable threshold to receive as one input the output of said addition and output means; and providing a second lookup table, said second lookup table's output providing a second input to said variable threshold, thereby enabling a desired delayed output signal from said variable threshold.

18. The method of implementing precision time delays of claim 17, wherein the output of said first and said second digital to analog converter has binary step sizes.

19. The method of implementing precision time delays of claim 17, wherein the output of said first and said second digital to analog converter has optimized step sizes.

20. The method of implementing precision time delays of claim 17, further comprising the step of amplifying said added output signal.

21. The method of implementing precision time delays of claim 17, wherein said at least two separate clock inputs are split into two distinct clock inputs.

22. The method of implementing precision time delays of claim 21, wherein said specified phase shift difference is 90 degrees between said two distinct clock inputs.

23. The method of implementing precision time delays of claim 21, wherein a first of said two distinct clock inputs is phase shifted 45 degrees forward and a second of said two distinct clock inputs is phase shifted 45 degrees backward.

24. The method of implementing precision time delays of claim 21, wherein a first of said two distinct clock inputs is not phase shifted and a second of said two distinct clock inputs is phase shifted 90 degrees backward.

25. The method of implementing precision time delays of claim 21, wherein a first of said two distinct clock inputs is not phase shifted and a second of said two distinct clock inputs is phase shifted 90 degrees forward.

26. The method of implementing precision time delays of claim 21, wherein a first of said two distinct clock inputs is phase shifted 90 degrees forward and a second of said two distinct clock inputs is not phase shifted.

27. The method of implementing precision time delays of claim 21, wherein a first of said two distinct clock inputs is phase shifted 90 degrees backward and a second of said two distinct clock inputs is not phase shifted.

* * * * *